(12) United States Patent
Bauer et al.

(10) Patent No.: US 10,206,319 B2
(45) Date of Patent: Feb. 12, 2019

(54) SUPPORT TABLE FOR INSPECTING AND/OR ORIENTING AN ELECTRONIC COMPONENT

(71) Applicant: ZKW GROUP GMBH, Wieselburg an der Erlauf (AT)

(72) Inventors: Karl Bauer, Schattendorf (AT); Peter Wurm, Eisenstadt (AT)

(73) Assignee: ZKW Group GMBH, Wieselburg an der Erlauf (AT)

( * ) Notice: Subject to any disclaimer, the term of this patent is extended or adjusted under 35 U.S.C. 154(b) by 169 days.

(21) Appl. No.: 15/304,585

(22) PCT Filed: Oct. 28, 2015

(86) PCT No.: PCT/AT2015/050269
§ 371 (c)(1),
(2) Date: Oct. 17, 2016

(87) PCT Pub. No.: WO2016/065383
PCT Pub. Date: May 6, 2016

(65) Prior Publication Data
US 2017/0049016 A1    Feb. 16, 2017

(30) Foreign Application Priority Data
Oct. 29, 2014 (AT) .................. 50782/2014

(51) Int. Cl.
*H05K 13/08* (2006.01)
*H05K 13/04* (2006.01)

(52) U.S. Cl.
CPC ......... *H05K 13/08* (2013.01); *H05K 13/0413* (2013.01); *H05K 13/0812* (2018.08); *H05K 13/0813* (2018.08)

(58) Field of Classification Search
CPC ........ B23Q 17/00; H05K 3/00; H05K 3/0008; H05K 3/30; H05K 13/0413; H05K 13/08; H05K 13/0812; H05K 13/0813
See application file for complete search history.

(56) References Cited

U.S. PATENT DOCUMENTS 5,044,072 A     9/1991 Blais et al.
5,081,656 A *  1/1992 Baker .................. G01N 23/043
                                            348/87

(Continued)

FOREIGN PATENT DOCUMENTS

EP          1244137 A2    9/2002
JP          H06167320 A   6/1994

(Continued)

OTHER PUBLICATIONS

International Search Report dated Mar. 9, 2016 for International Patent Application No. PCT/AT2015/050269.

(Continued)

*Primary Examiner* — Carl Arbes
(74) *Attorney, Agent, or Firm* — Eversheds Sutherland (US) LLP

(57) ABSTRACT

A support table (1) for inspecting and/or orienting electronic components (B) prior to the assembling of a printed circuit board with these components, onto which support table the components, which are initially held at a nozzle end (7) by means of negative pressure, are set down following release by the nozzle end, wherein the table (1) has a transparent support plate (2), preferably a glass plate, and a delimiting edging (5, 6p, 6z, 12) preventing a displacement of a component (B) deposited temporarily on the support plate caused by air exiting the nozzle is provided, and an optical (Continued)

Figure 1:
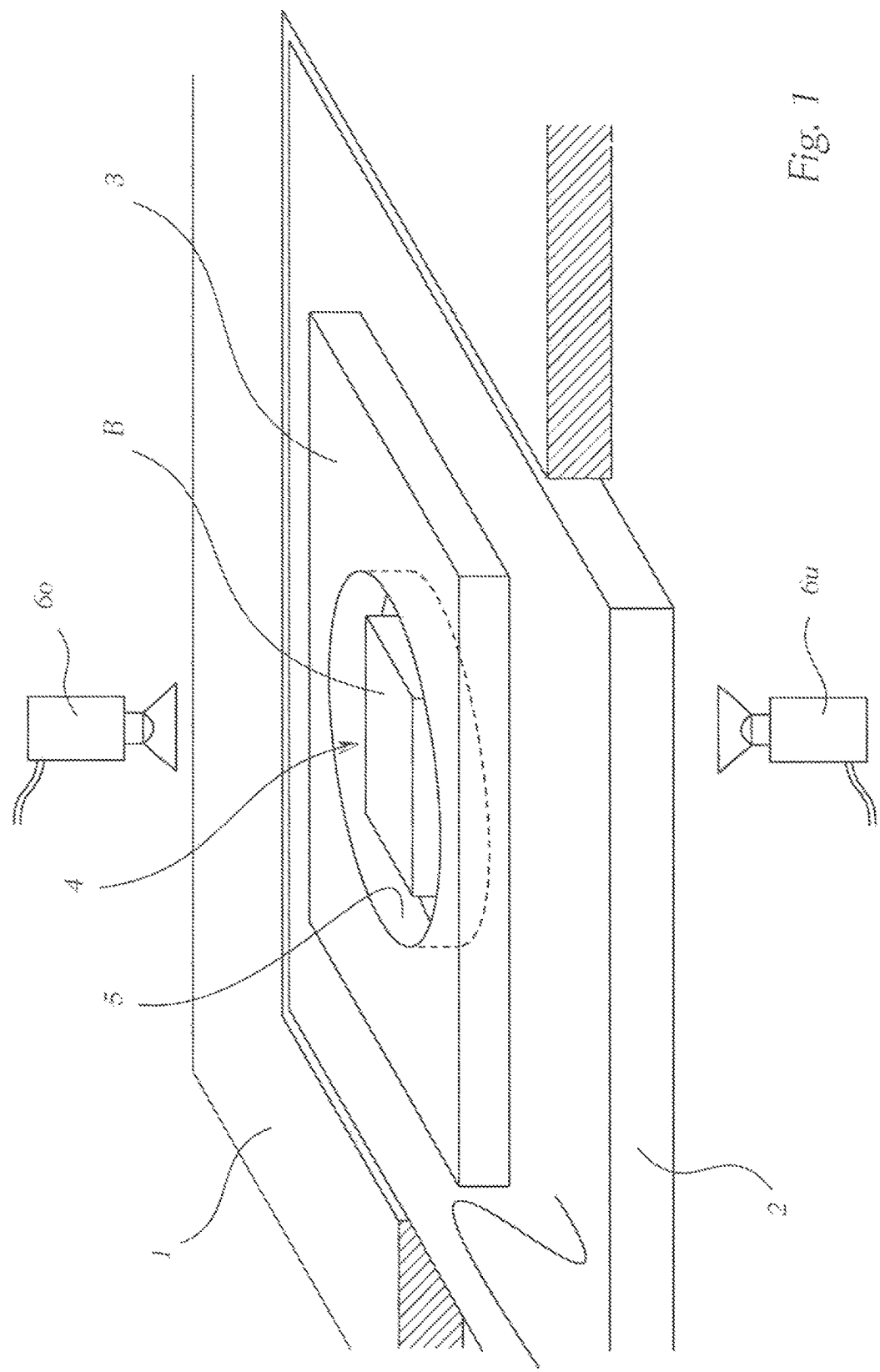

inspection device is arranged below the support table (6*u*) and an optical inspection device is arranged above the support table (6*o*).

17 Claims, 3 Drawing Sheets

(56) References Cited

U.S. PATENT DOCUMENTS

| | | | |
|---|---|---|---|
| 5,420,691 A | 5/1995 | Kawaguchi | |
| 6,457,232 B1 * | 10/2002 | Isogai | H05K 13/0413 |
| | | | 29/833 |
| 7,192,150 B2 * | 3/2007 | Miyakawa | H05K 13/0413 |
| | | | 29/721 |

FOREIGN PATENT DOCUMENTS

| | | | |
|---|---|---|---|
| JP | 4224268 B2 * | 2/2009 | |
| WO | 9920977 A1 | 4/1999 | |
| WO | 2013168277 A1 | 11/2013 | |

OTHER PUBLICATIONS

First Office Action dated Aug. 26, 2015 for Austrian Application No. A 50782/2014.

\* cited by examiner

SUPPORT TABLE FOR INSPECTING AND/OR ORIENTING AN ELECTRONIC COMPONENT

The invention relates to a support table for inspecting and/or orienting electronic components prior to the assembly of a printed circuit board with these components.

Printed circuit boards are currently assembled with electronic components of very small dimensions primarily by means of the SMT method in order to produce flat electronic modules. The assembly process is usually performed using automatic component assembly (pick and place) machines, wherein the components are taken from feed belts usually by being suctioned on a component assembly head. In many cases the component is deposited on a support table, on which it is oriented or inspected. Following the inspection and/or orientation, the component is received by an arm, again by negative pressure, and is brought in the correct position onto the printed circuit board to be assembled. Orientation is necessary on the one hand in view of the correct positioning of the solder connections, but on the other hand, in particular in the case of components which have sensor faces or light-emitting surfaces, such as in particular LEDs, also in view of the correct positioning of the sensor and light-emitting surfaces.

An optical inspection is necessary especially when, at package level, the features relevant for the orientation of the component are positioned only with high tolerance relative to the outer contours of the housing (package) or when, for example, the separation of the components on a substrate is performed with high tolerance compared with the component dimensions and consequently the position of the face down orientated contact areas cannot be derived from the outer contour of said component. Sawing removes a component from a substrate (usually a silicon wafer), wherein the substrate forms a body of individual components which are subject to a common production process. The exact position of the contact areas can be determined from below by means of an optical inspection apparatus through an optically transparent support table. In the case of optoelectronic components it is particularly important to very accurately determine the position of the contact areas as viewed from below in combination with the position of the light source or the light exit area or generally the structure of the optical functional unit as viewed from above so as to enable a precise positioning on the component carrier downwardly or in the focus of an associated optics upwardly.

Document U.S. Pat. No. 5,044,072 A discloses an apparatus for orienting and placing electronic components in an optical inspection system in which guide elements assist this process in a predefined, planar working range of the inspection system. Here, the guide elements are used in such a way that the vacuum suction apparatus only fixes a component by forming a vacuum when said component is correctly positioned in the working area of the apparatus. If incorrectly positioned, the component would rest in a skewed manner on a guide element and it would thus be impossible to form the vacuum. On the other hand, if the guide elements were absent, the opening of the vacuum suction apparatus could be partly covered, which would reduce the holding force of the vacuum and would thus allow a component to detach from the holding apparatus during the inspection or handling. The purpose of these guide elements thus lies in defining the working area of the optical inspection apparatus and/or in ensuring the correct function of the vacuum suction apparatus fixing the component in the inspection position. The guide elements and the vacuum suction apparatus are disposed in the same module of the apparatus and together therewith form the desired function.

Document JP H06167320 A describes an apparatus for inspecting SMD components, wherein the distance between the plane of the electrical connections and that of the lower side of the component is measured. The used guide elements serve to delimit the planar working area of the inspection apparatus in which an optical measurement device is arranged. A vacuum suction apparatus holds the component in position during the inspection. In order to enable an exact inspection, the guide elements do not have any contact with the connections of the component. The guide elements and the vacuum suction apparatus lie in the same module of the apparatus and together therewith form the desired function.

Document EP 1244137 A2 discloses a manipulation apparatus for electronic components, preferably following the separation of components from a common component carrier. The invention comprises a displaceable transfer support in order to physically displace the sawn components from the sawing table to the subsequent process device without the orientation of the separated components changing, since the components, once sawn, continue to be securely held with the aid of vacuum suction apparatuses and are then fixed in a frame since the components are clamped in this frame by displacement of at least an edge of the transfer support. The apparatus thus comprises a component-clamping device having at least one displaceable edge.

It has been found in practice that a component is released again as a result of undesirable airflows, but in particular also as a result of the airflow of the arm that holds the component by suction, or as a result of pressure reduction or pressure increase, and that the component can therefore shift on the support table, which leads to undesirable interruptions in the operation of an automated component assembly process.

The object of the invention lies in creating a support table with which the above-mentioned disadvantages can be avoided.

This object is achieved with a support table of the type mentioned in the introduction, in which, in accordance with the invention, the table has a transparent support plate, preferably a glass plate, and a delimiting edging preventing a displacement of a component deposited temporarily on the support plate is provided.

The main influence of three-dimensional air turbulences manifests itself in the form of a shearing force acting laterally on the component. In order to dissipate this shearing force, it is sufficient when a delimiting edging is mounted on the worktable. As a result of this simple construction, the component does not have to be fixed to the worktable. The construction is suitable both for small and large components, provided these are situated within the working range of the optical sensor. Compared with optical inspections by means of the specified methods according to the prior art, the component assembly process is not slowed by this loose depositing of the component.

Thanks to this design of the support table, a deposited component is securely held in a defined region, such that it can be examined for example by means of optical sensors both from above and from below and can also be oriented in a predefined position. Here, the component can be also be deposited again in a corrected position.

Provision is made in an advantageous embodiment for an auxiliary plate having at least one continuous recess to be provided on the support plate, wherein the delimiting edging is formed by the walls of the at least one recess. An auxiliary plate of this type can be placed on the support plate of the support table easily and in the desired dimensions and design. Here, it is advantageous if the auxiliary plate is transparent so that optical sensors are disturbed as little as possible by light-reflecting or light-absorbing parts.

In a variant of the invention, provision is made for at least one indentation for receiving at least one component to be formed in the transparent support plate, wherein the delimiting edging is formed by the walls of the at least one indentation. A design of this type is particularly advantageous when many components of substantially identical dimensions are used, since in this case it is possible to dispense with an auxiliary plate.

In many cases it is recommended when the edging is substantially circular, since a universal usability with little swirling of airflows or gas flows is provided.

On the other hand, it may also be advantageous for the improved fixing of components if the edging is polygonal, preferably rectangular or square.

In a further aspect the light of the illumination of the optical inspection device can be disadvantageously reflected by the wall of the edging, which hinders or falsifies the evaluation of the optical sensor. In order to reduce this effect, it is advantageous to form the walls of the edging in such a way that the reflections of the light are minimised, which can be implemented by a suitable construction of the angle of inclination of the wall surface of the edging deviating from the vertical. By way of example, a circular edging thus usually has a cylindrical shape, whereas the aforementioned embodiment has a conical shape.

Alternatively or additionally, the wall faces of the edging have a suitable non-reflective or diffusely dissipative coating or a roughened surface in order to damp the light reflections.

Figure 2:
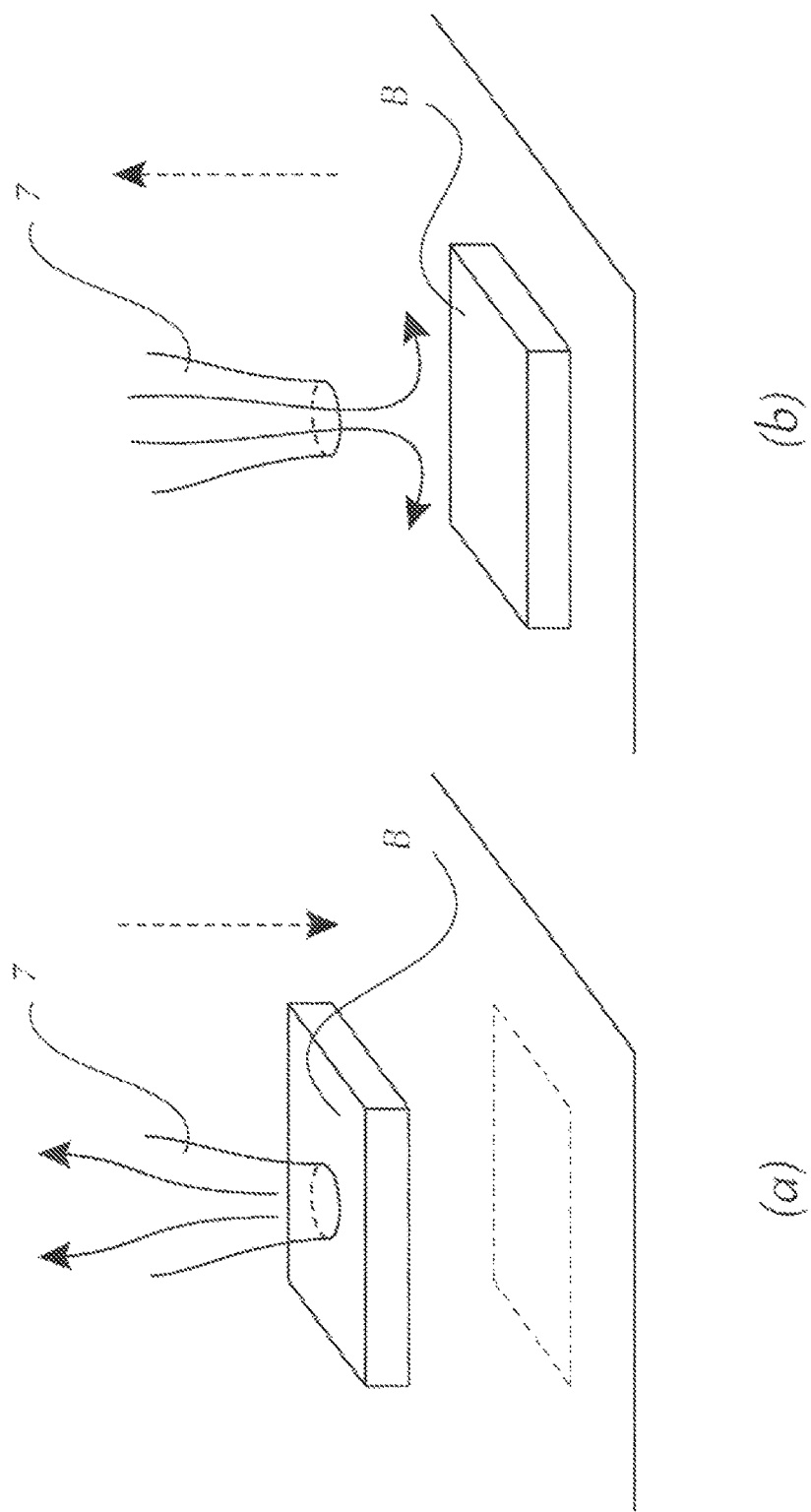
Figure 3:
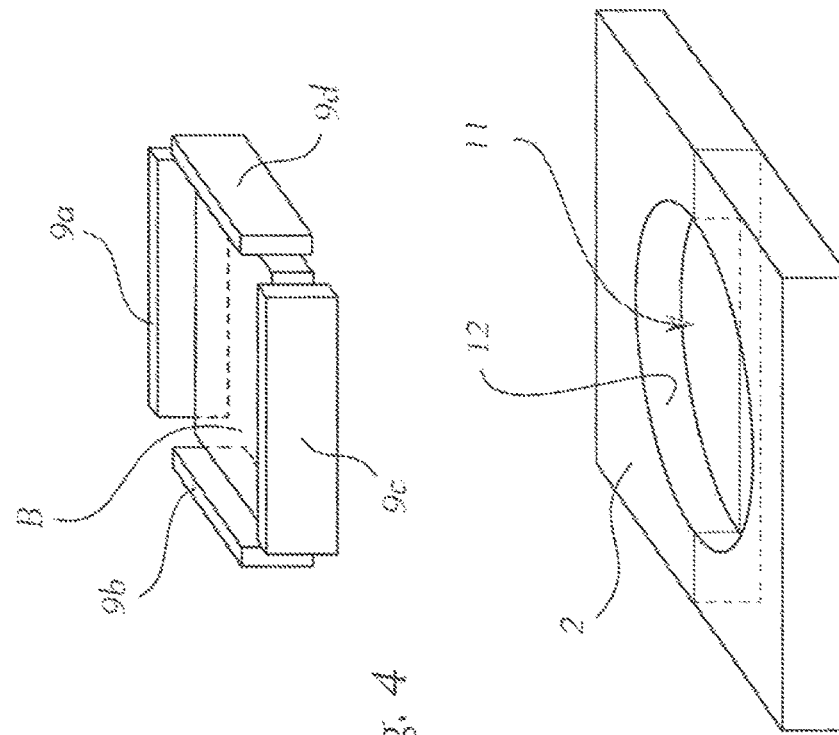
Figure 4:
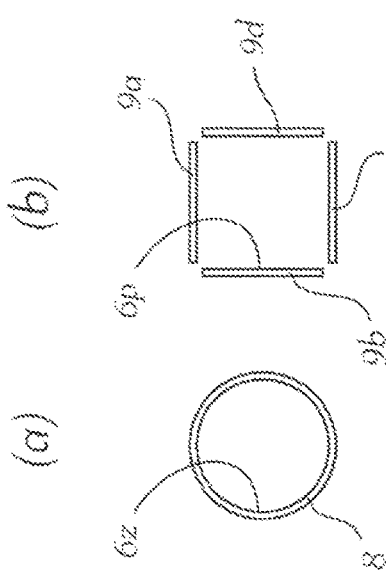
Figure 5:
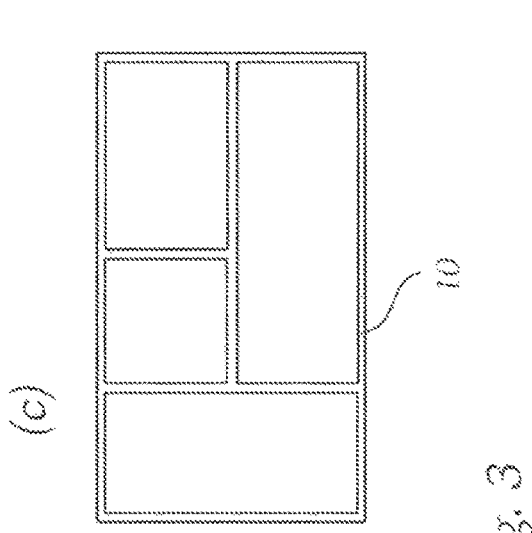

The invention together with further advantages is explained in greater detail hereinafter on the basis of exemplary embodiments which are illustrated in the drawing, in which FIG. 1 schematically and diagrammatically shows a support plate embedded in a support table, FIG. 2 schematically shows the placement and setting down of a component on a support plate, FIG. 3a to c show plan views of different geometries of the delimiting edging, FIG. 4 diagrammatically and schematically shows the arrangement of delimiting walls around a component, and FIG. 5 shows a variant in which an indentation is formed in the transparent support plate.

FIG. 1 schematically shows a support table 1, in which a support plate 2 is embedded. This support plate 2 preferably consists of glass and is therefore transparent.

An auxiliary plate 3, which is preferably likewise transparent, with a recess 4 which in the present case is circular cylindrical is situated on the support plate 2. A component B can be situated within this recess 4 and is thus surrounded by a cylindrical edging 5 formed by the recess 4. The component, which is secured in this way against extensive shifting by means of the edging 5 can be inspected for example by an upper optical sensor 6 and by a lower optical sensor 6u, here through the support plate 2. The optical sensors can be cameras for example, which supply orientation information with regard to the component to a computing unit for controlling the assembly process. For special applications, the optical sensors can also be 3D cameras, which for example operate stereoscopically or in accordance with the time-of-flight principle (for example a PMD or "photonic mixing device"). The optical sensors can be sensitive in the purely optical range or also additionally or selectively in the ultraviolet or infrared range. Monochromatic light for the illumination is usually preferred, but polychromatic light is also possible. The sensors themselves are often sensitive in a wide spectral range. It is in any case important that the spectral range is matched to the optical transparency of the support table with light source and sensor.

FIG. 2 schematically shows how undesirable airflows can occur, which shift a component B. To the left of FIG. 2 it can be seen that a component B is held by the nozzle end 7 of a robot arm (not shown in greater detail), wherein negative pressure, indicated by arrows pointing upward, holds the component B. The component B, held in this way, is brought during the assembly process to the support plate and set down there by initially reducing the negative pressure in the nozzle 7 and then, in order to securely set down the component B, transitioning the negative pressure into an overpressure ranging from 1 to 100 mbar. A small and lightweight component B can be shifted or "blown out of place" by this overpressure.

FIG. 3a shows a circular wall 8 in plan view which provides a corresponding cylindrical edging 6z for a component. Four wall parts 9a to 9d arranged in a square are provided in FIG. 3b, which together provide an edging 6p in the form of a square prism for a component. By contrast, FIG. 3c shows a wall array 10, which in total provides four edgings for components of different dimensions and geometries and can be used universally.

FIG. 4 shows the arrangement of wall parts 9a to 9d—corresponding to FIG. 3b—around a square component B.

Lastly, FIG. 5 shows a design in which an indentation 11 is directly formed in the support plate 2, in which indentation a component can be received. In the present case this indentation is circular in plan view and forms a cylindrical edging 12.

The edging 5, 6z, 12 should have a distance between edging and component of at least 2 mm for distortion-free optical inspection, and can extend as far as the edge of the working range, i.e. the field of view of the camera, of the optical sensor.

The various embodiments of the surfaces of the edging 5, 6z, 12 are not illustrated.

The illumination of the optical inspection devices 6u and 6o is not illustrated. It can be both integrated in the camera, for example as a concentric illumination ring, and can be formed as a light source lighting from the side of the support table or the camera, for example via goosenecks having light guides.

The invention claimed is:

1. A support table (1) for inspecting and/or orienting electronic components (B) prior to assembly of a printed circuit board with the electronic components, wherein the electronic components are initially held at a nozzle end (7) by negative pressure and are thereafter set down on the support table following release of the negative pressure and the exiting of air by the nozzle end, the support table (1) comprising:
   a transparent support plate (2);
   an auxiliary plate (3) disposed on the transparent support plate, wherein the auxiliary plate comprises at least one recess (4) defining a delimiting edging (5, 6p, 6z, 12) configured to surround the electronic components and prevent a displacement of the electronic components (B) deposited on the transparent support plate by the release of the negative pressure and the exiting of air by the nozzle end;
   a lower optical inspection device (6u) arranged below the support table; and an upper optical inspection device (6o) arranged above the support table.

2. The support table (1) of claim 1, wherein the delimiting edging (5) is formed by one or more walls of the at least one recess.

3. The support table (1) of claim 1, wherein the auxiliary plate (3) is transparent.

4. The support table (1) of claim 1, wherein the delimiting edging (5, 6z, 12) is substantially circular cylindrical.

5. The support table (1) of claim 1, wherein the delimiting edging (10) is polygonal.

6. The support table (1) of claim 2, wherein the one or more walls (8, 9a . . . d, 10) are provided in the auxiliary plate around the at least one recess in order to form the delimiting edging.

7. The support table (1) of claim 1, wherein a surface of the delimiting edging (5, 6z, 12) is inclined at an angle relative to normal of a support surface of the support table.

8. The support table (1) of claim 7, wherein the angle of inclination lies between −30° and −1° or between +1° and +30°.

9. The support table (1) of claim 1, wherein a surface of the delimiting edging (5, 6z, 12) is optically diffusely scattering or non-reflective.

10. The support table (1) of claim 1, wherein a surface of the delimiting edging (5, 6z, 12) is roughened.

11. The support table (1) of claim 1, wherein the lower optical inspection device and/or the upper optical inspection device comprises a camera.

12. The support table (1) of claim 1, wherein the lower optical inspection device and/or the upper optical inspection device comprises a stereoscopic camera.

13. The support table (1) of claim 1, wherein the lower optical inspection device and/or the upper optical inspection device comprises a camera operable in accordance with a time-of-flight method.

14. The support table (1) of claim 11, wherein the upper optical inspection device is different from the lower optical inspection device.

15. The support table (1) of claim 1, wherein the transparent support plate (2) comprises a glass plate.

16. The support table (1) of claim 5, wherein the delimiting edging (10) is rectangular or square.

17. A support table (1) for inspecting and/or orienting electronic components (B) prior to assembly of a printed circuit board with the electronic components, wherein the electronic components are initially held at a nozzle end (7) by negative pressure and are thereafter placed on the support table following release of the negative pressure at the nozzle end, the support table (1) comprising:
  a transparent support plate (2) disposed on support table (1);
  at least one indentation (11) m the transparent support plate, wherein the at least one indentation defines a delimiting edging (12) configured to surround the electronic components and prevent a displacement of the electronic components (B) deposited on the support plate by the release of the negative pressure at the nozzle end;
  a lower optical inspection device (6u) arranged below the support table; and
  an upper optical inspection device (6o) arranged above the support table.

* * * * *